United States Patent [19]
Levi et al.

[11] Patent Number: 5,541,118
[45] Date of Patent: Jul. 30, 1996

[54] PROCESS FOR PRODUCING CADMIUM SULFIDE ON A CADMIUM TELLURIDE SURFACE

[75] Inventors: Dean H. Levi, Lakewood; Art J. Nelson, Longmont; Richard K. Ahrenkiel, Lakewood, all of Colo.

[73] Assignee: Midwest Research Institute, Kansas City, Mo.

[21] Appl. No.: 446,466

[22] Filed: May 22, 1995

[51] Int. Cl.$^6$ ................................................ H01L 31/18
[52] U.S. Cl. .................. 437/4; 427/76; 427/535; 427/569; 427/575; 136/258; 136/260; 136/264; 257/614; 257/631
[58] Field of Search .................... 437/4–5, 980; 427/74, 76, 535, 569, 575; 136/260, 264, 258 PC; 257/614, 631

[56] References Cited

U.S. PATENT DOCUMENTS

| | | | |
|---|---|---|---|
| 4,388,483 | 6/1983 | Basol et al. | 136/260 |
| 4,629,514 | 12/1986 | Suda | 437/81 |
| 4,709,119 | 11/1987 | Wörner | 136/260 |
| 5,484,736 | 1/1996 | Hasoon et al. | 437/4 |

OTHER PUBLICATIONS

Sandroff, et al., "Dramatic enhancement in the gain of a GaAs/AlGaAs heterostructure bipolar transistor by surface chemical passivation," *Appl. Phys. Lett.*, vol. 51(1), pp. 33–35, 6 Jul. 1987.

Yablonovitch, et al., "Nearly ideal electronic properties of sulfide coated GaAs surfaces," *Appl. Phys. Lett.*, vol. 51(6), pp. 439–441, 10 Aug. 1987.

Farrow, et al., "Raman scattering measurements of decreased barrier heights in GaAs following surface chemical passivation," *Appl. Phys. Lett.*, vol. 51(23), pp. 1931–1933, 7 Dec. 1987.

Nelson, et al., "Processing and characterization of large–grain thin–film CdTe," *J. Vac. Sci. Technol.*, vol. A 12(5), pp. 2803–2807, Sep./Oct. 1994.

*Primary Examiner*—Aaron Weisstuch
*Attorney, Agent, or Firm*—Edna M. O'Connor

[57] ABSTRACT

A process for producing a layer of cadmium sulfide on a cadmium telluride surface to be employed in a photovoltaic device. The process comprises providing a cadmium telluride surface which is exposed to a hydrogen sulfide plasma at an exposure flow rate, an exposure time and an exposure temperature sufficient to permit reaction between the hydrogen sulfide and cadmium telluride to thereby form a cadmium sulfide layer on the cadmium telluride surface and accomplish passivation. In addition to passivation, a heterojunction at the interface of the cadmium sulfide and the cadmium telluride can be formed when the layer of cadmium sulfide formed on the cadmium telluride is of sufficient thickness.

6 Claims, 7 Drawing Sheets

PROCESS FOR PRODUCING CADMIUM SULFIDE ON A CADMIUM TELLURIDE SURFACE

The United States Government has rights in this invention under Contract No. DE AC36-83CH10093 between the United States Department of Energy and the National Renewable Energy Laboratory, a division of the Midwest Research Institute.

BACKGROUND OF THE INVENTION

I. Field of the Invention

The present invention relates to a process for producing a cadmium sulfide layer on a cadmium telluride surface by exposing a surface of cadmium telluride to a hydrogen sulfide plasma.

II. Description of the Prior Art

Cadmium telluride shows promise for terrestrial photovoltaic applications primarily because of its direct band gap of 1.5 eV, which is optimum for solar energy conversion at air mass 1. Especially beneficial is a cadmium telluride film having relatively large cadmium telluride grain sizes, with such sizes preferably above about 20 µm. This larger grain size reduces surface recombination and interface state density with increased efficiency being directly proportional to grain size. Conversely, films of a smaller grain size have numerous boundaries of individual crystals, and such boundaries critically inhibit the flow of charge carriers through the film.

Commonly-assigned copending U.S. patent application Ser. No. 08/308,362, filed Sep. 19, 2994, (now U.S. Pat. No. 5,484,736, issued Jan. 16, 1996) and incorporated herein by reference in its entirety, teaches a process for producing large grain cadmium telluride. In summary, the process taught by the copending application produces a cadmium telluride polycrystalline film having grain sizes greater than about 20 µm by first depositing cadmium telluride on a substrate and subsequently exposing the deposited cadmium telluride to an inert gas such as helium at an elevated temperature. While a large-grain cadmium telluride surface significantly improves solar energy collecting efficiency in devices employing such a surface, untoward performance effects can still occur because of surface states, surface recombination velocity, and the like.

It is therefore apparent that passivation of the cadmium telluride surface, even though it may be comprised of large-grain cadmium telluride, would be highly beneficial to the efficiency of such solar-energy collecting devices. Accordingly, a primary object of the present invention is to provide a process for producing on a cadmium telluride surface a cadmium sulfide layer which functions to passivate surface states and thereby reduce surface recombination velocity.

Another object of the present invention is to provide a process for producing the cadmium sulfide layer wherein a plasma application of hydrogen sulfide to the cadmium telluride surface under appropriate conditions yields the layer and produces a heterojunction at the cadmium sulfide/cadmium telluride interface.

These and other objects of the present invention will become apparent throughout the description of the invention which now follows.

SUMMARY OF THE INVENTION

The present invention is a process for producing a layer of cadmium sulfide on a cadmium telluride surface to be employed in a photovoltaic collecting device. The process first comprises providing a cadmium telluride surface wherein the cadmium telluride is present in single crystal or polycrystalline form. Thereafter, the cadmium telluride surface is exposed to a hydrogen sulfide plasma at an exposure flow rate, an exposure time and an exposure temperature sufficient to permit reaction between the hydrogen sulfide and cadmium telluride to thereby accomplish passivation by forming a cadmium sulfide layer on the cadmium telluride surface. Deposition of a cadmium sulfide layer greater than about 10 Å not only passivates the surface, but also forms a heterojunction between the cadmium sulfide and cadmium telluride.

In the preferred embodiment, maximum benefit from a cadmium sulfide layer is realized where the cadmium telluride surface is a large grain ($\geq$ about 20 µm), polycrystalline cadmium telluride film disposed on a glass substrate. The hydrogen sulfide plasma application is preferably accomplished in an exposure time of from about 20 minutes to about 30 minutes at an exposure temperature from about 150° C. to about 200° C. The inventive process thereby produces a cadmium sulfide layer that functions to reduce the surface recombination velocity of the cadmium telluride by passivating surface states to consequently form a heterojunction and improve the efficiency of solar collecting devices employing collectors made according to this inventive process.

DETAILED DESCRIPTION OF THE PREFERRED EMBODIMENT

The present invention is a process for producing a layer of cadmium sulfide on a cadmium telluride surface. In the preferred embodiment, the cadmium telluride surface is a large grain ($\geq$ about 20 µm), polycrystalline cadmium telluride film disposed on a glass substrate. The Example that follows reports the results of numerous experimentations wherein respective polycrystalline cadmium telluride films disposed on glass substrates were subjected to hydrogen sulfide plasma treatments and analyzed to yield the composite results here shown.

EXAMPLE

Large-grain polycrystalline cadmium telluride films were fabricated on glass substrates in accord with the teaching of the above-incorporated copending patent application prior to in-situ plasma processing. Electron cyclotron resonance (ECR) plasma exposure was performed with a commercial ASTEX compact ECR source (2.45 GHz, 0.0875 Tesla) in a vacuum preparation chamber. The ECR input power was 100 W. Hydrogen sulfide gas (99.5%) was metered into the chamber through a mass-flow controller at a flow rate of 10 cm$^3$/s hydrogen sulfide which produced a pressure of 1 m Torr. in the chamber (turbomolecular pumped, 520 l/s) for the plasma exposure. Pressure was measured with a cold cathode gauge. Plasma processing was performed at normal incidence and at ambient, 100° C., and 200° C. Temperature was measured with a thermocouple in contact with the back surface of the glass substrate. The duration of plasma exposure did not exceed 30 minutes.

Figure 1A:
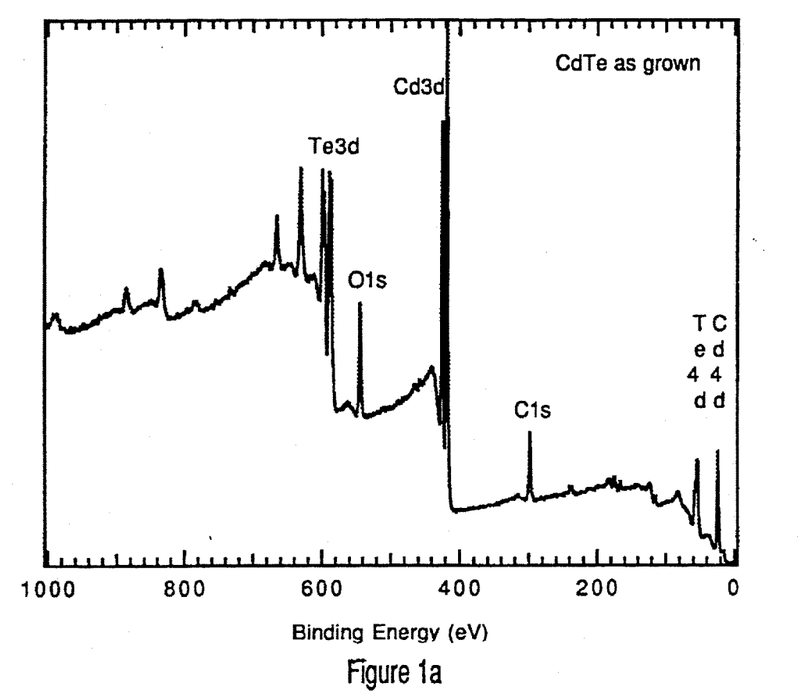
FIG. 1a is a high resolution x-ray photoemission spectroscopy (XPS) spectra of a large-grain, polycrystalline cadmium telluride surface.
Figure 1B:
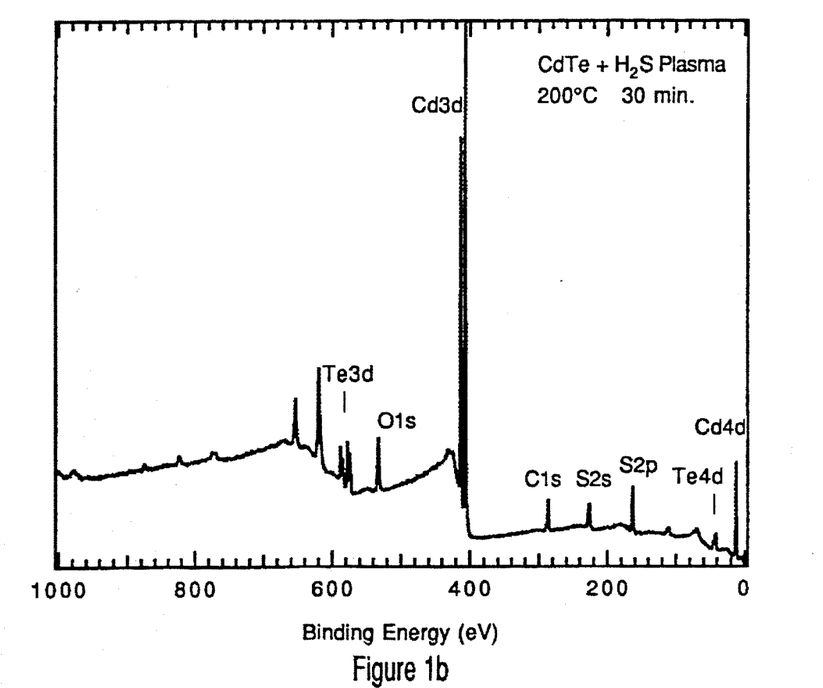
FIG. 1b is a high resolution XPS spectra of the cadmium telluride surface depicted in FIG. 1a after plasma application of hydrogen sulfide.

To determine the degree of passivation of surface states, time-resolved photoluminescence (TRPL) was used to measure carrier lifetimes. Measurement of carrier lifetimes is a very sensitive measure of the surface recombination velocity, which is directly affected by passivation of surface states. Referring to FIGS. 1a and 1b, x-ray photoemission spectroscopy (XPS) survey spectra clearly show the presence of sulfur (S 2p and 2s peaks) at the surface following hydrogen sulfide plasma processing. Also shown is the diminished intensity of the Te 3d and Te 4d core level peaks in the plasma-processed spectrum. These results indicate that there is a sulfur overlayer present due to the hydrogen sulfide plasma processing.

Figure 2A:
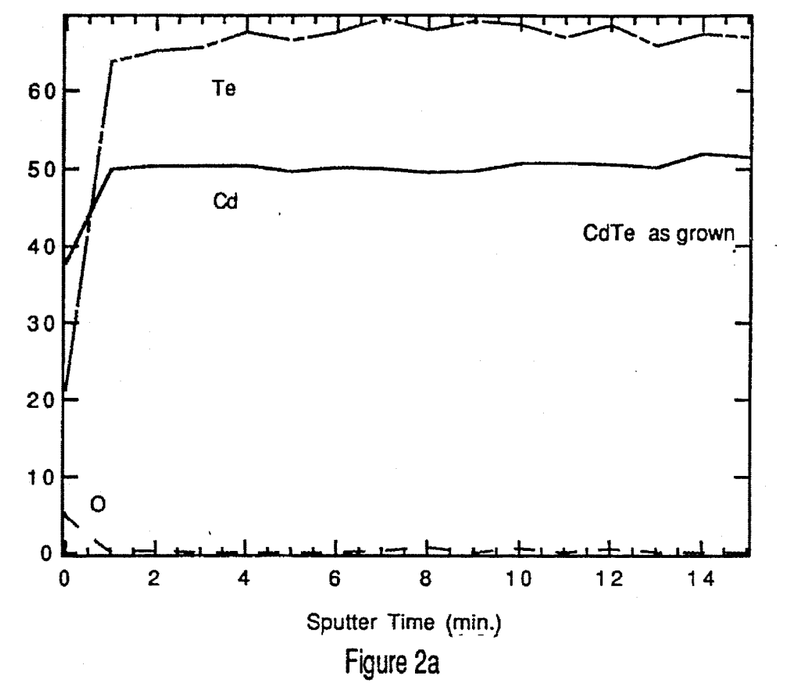
FIG. 2a is an XPS compositional depth profile (by sputter etching) of a large-grain, polycrystalline cadmium telluride surface.
Figure 2B:
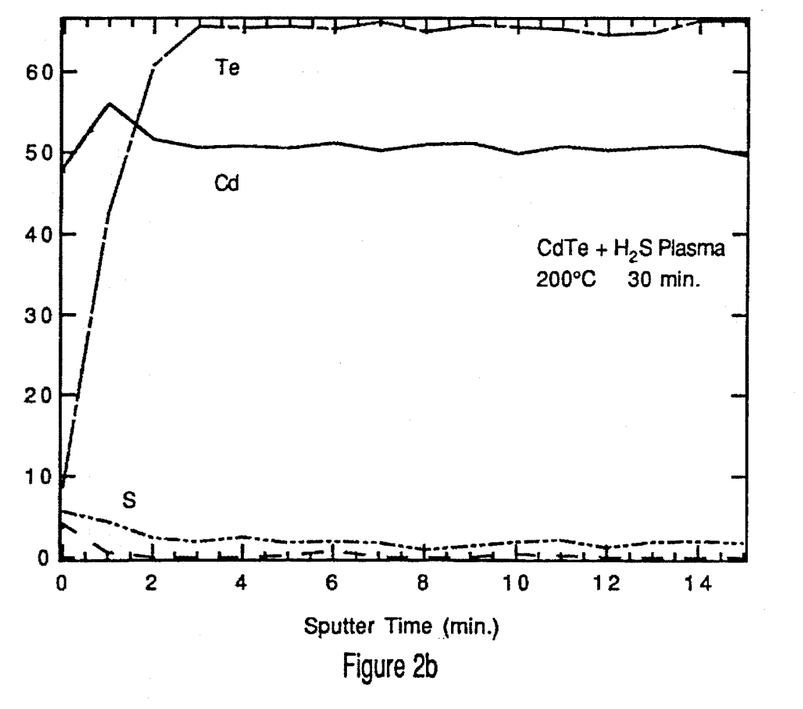
FIG. 2b is an XPS compositional depth profile (by sputter etching) of the cadmium telluride surface depicted in FIG. 2a after plasma application of hydrogen sulfide.
Figure 3A:
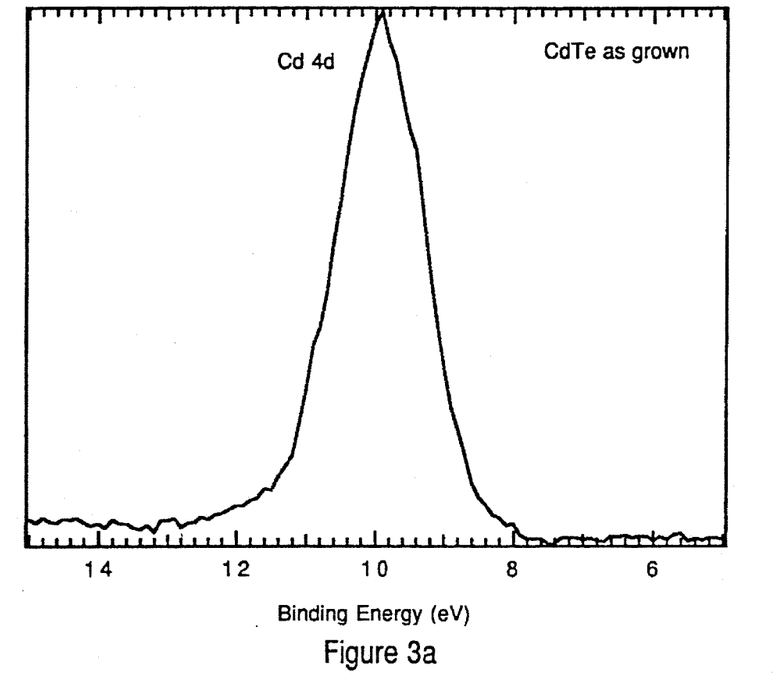
FIG. 3a is a high resolution XPS spectra showing binding energy of the cadmium 4d core level of a large-grain, polycrystalline cadmium telluride surface.
Figure 3B:
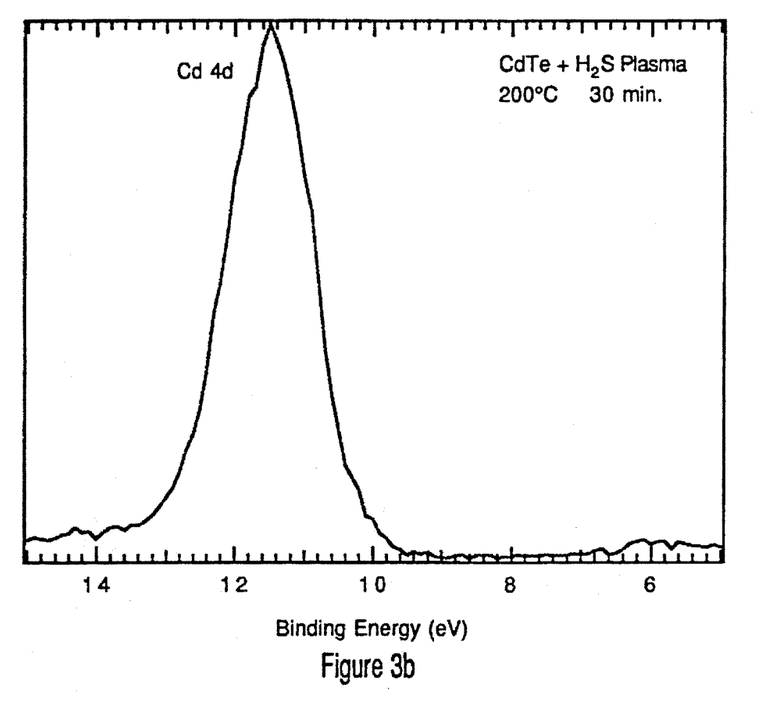
FIG. 3b is a high resolution XPS spectra showing binding energy of the cadmium 4d core level of the cadmium telluride surface depicted in FIG. 3a after plasma application of hydrogen sulfide.
Figure 4A:
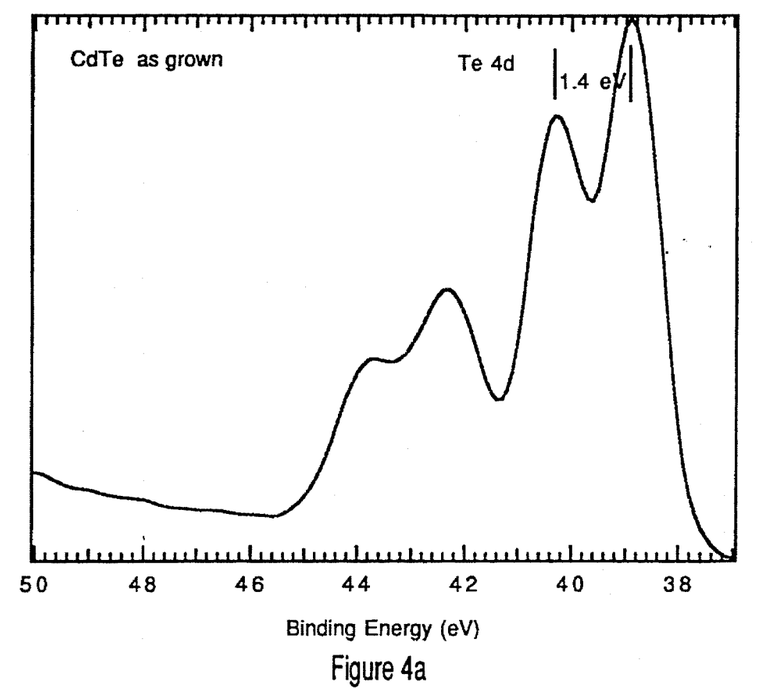
FIG. 4a is a high resolution XPS spectra showing binding energy of the tellurium 4d core level of a large-grain, polycrystalline cadmium telluride surface.
Figure 4B:
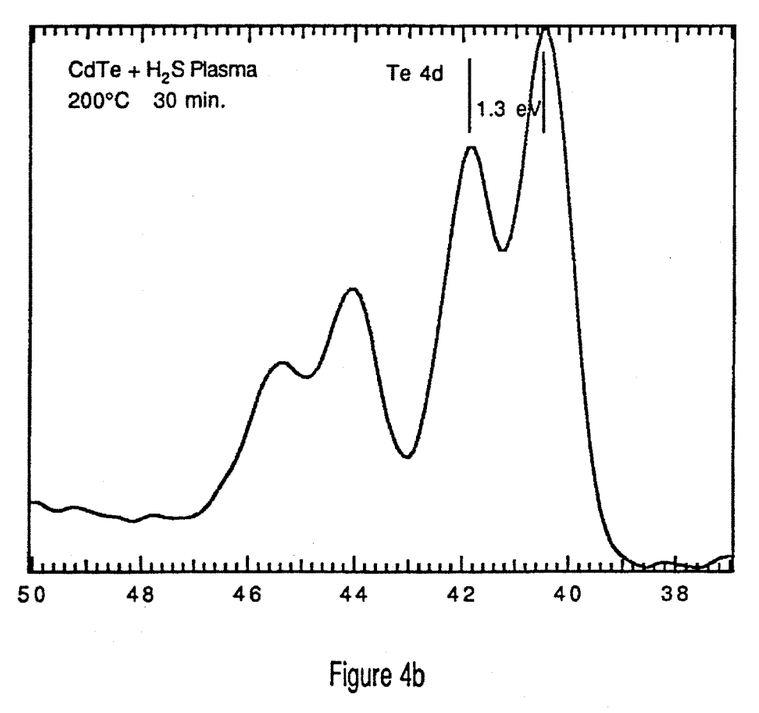
FIG. 4b is a high resolution XPS spectra showing binding energy of the tellurium 4d core level of the cadmium telluride surface depicted in FIG. 4a after plasma application of hydrogen sulfide.

Referring to FIGS. 2a and 2b, XPS compositional depth profiling was used to determine the distribution of sulfur in the near surface region of the polycrystalline cadmium telluride. Sputter etching was performed with 3 keV argon ions rastered over a 2×2 mm area giving a sputter etch rate of ∞120 Å/minute. The XPS compositional depth profiles for cadmium telluride samples processed at T$\leq$300° C. clearly show that the distinct sulfur overlayer is removed following one minute of sputtering. Thus, the thickness of this sulfur overlay is about 100 Å. Also, these results indicate that, in addition to a distinct overlayer, the sulfur diffuses into the polycrystalline cadmium telluride to a depth of $\geq$200 Å (temperature dependent) for the 30 minute hydrogen sulfide plasma exposure. This diffusion occurs predominately at grain boundary interfaces (thermodynamically more favorable); and therefore would also passivate any intergranular defect states in addition to passivating intragranular defect states.

Figure 5:
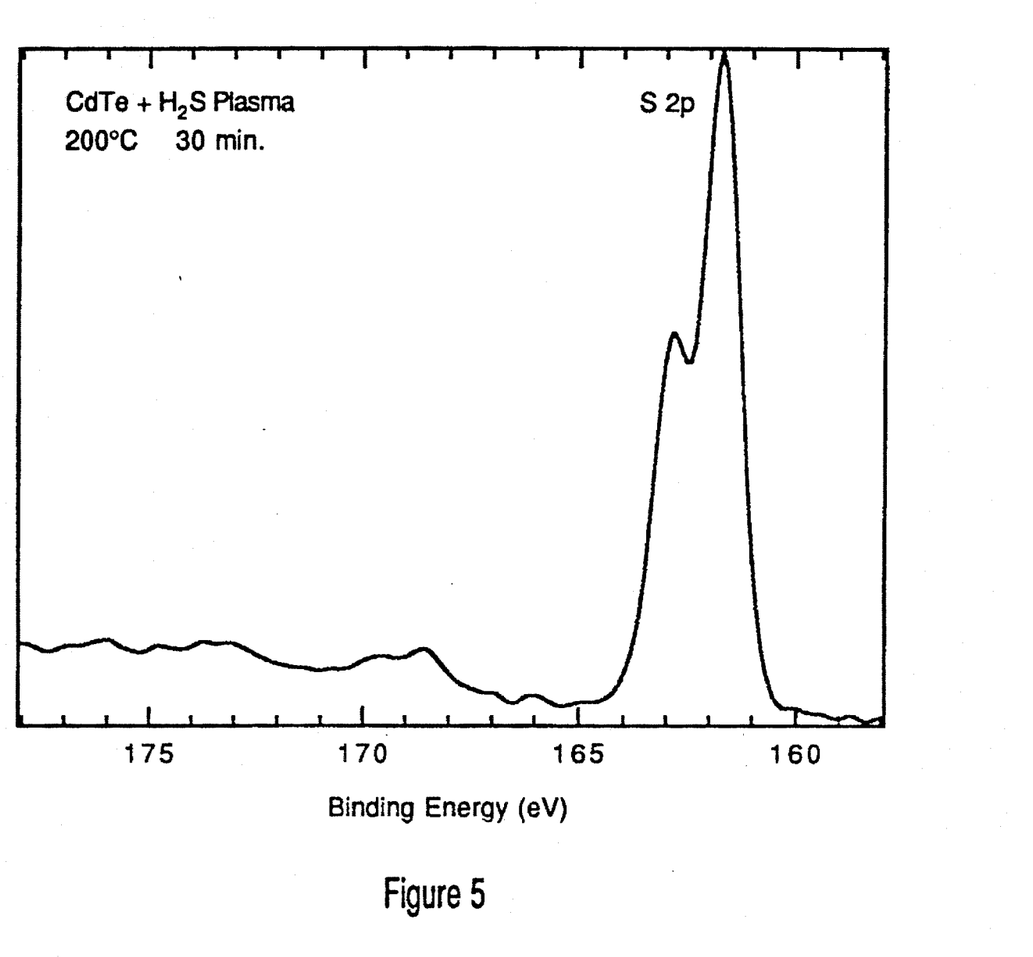
FIG. 5 is a high resolution XPS spectra showing binding energy of the sulfur 2p core level of a large-grain, polycrystalline cadmium telluride surface after plasma application of hydrogen sulfide to the cadmium telluride surface.

High resolution XPS Cd 4d, Te 4d and S 2p core level spectra and valence band spectra were used to determine the chemical and electronic effects, respectively, of hydrogen sulfide plasma processing in the near-surface region of the cadmium telluride film. As shown in FIGS. 3a and 3b, and 4a and 4b, the Cd 4d (FIGS. 3a and b) and Te 4d (FIGS. 4a and b) core levels are shifted 1.5 eV toward higher energy following hydrogen sulfide plasma processing at 200° C. Additionally, as shown in FIG. 5, the S 2p core level binding energy is indicative of sulfide formation, such as sulfur bonded in cadmium sulfide. Thus, this data, in conjunction with that shown and described for the earlier Figures, indicates that a thin layer of cadmium sulfide has been formed on top of the cadmium telluride surface due to hydrogen sulfide plasma processing. Diffusion of sulfur into the cadmium telluride layer results in the formation of a ternary CdS$_{1-x}$Te$_x$ alloy. Therefore, a CdS/CdS$_{1-x}$Te$_x$/CdTe graded heterojunction device structure is produced.

Figure 6A:
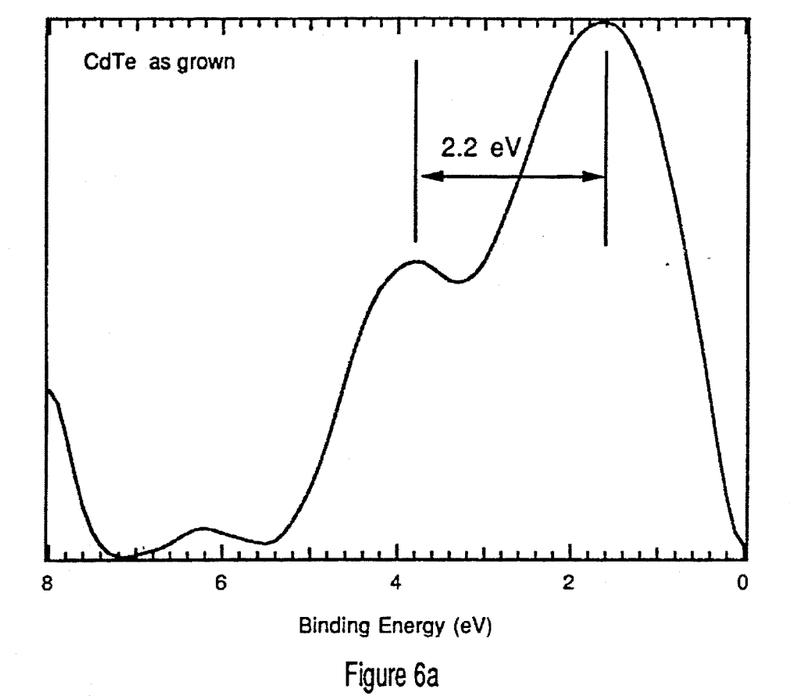
FIG. 6a is a high resolution XPS spectra showing the valence band of a large-grain, polycrystalline cadmium telluride surface.
Figure 6B:
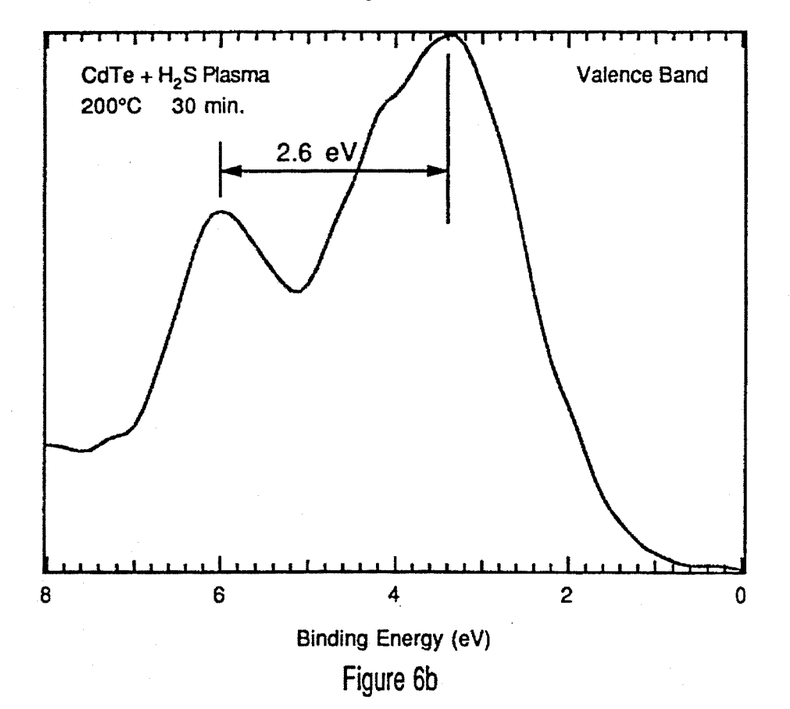
FIG. 6b is a high resolution XPS spectra showing the valence band of the cadmium telluride surface depicted in FIG. 6a after plasma application of hydrogen sulfide.
Figure 7:
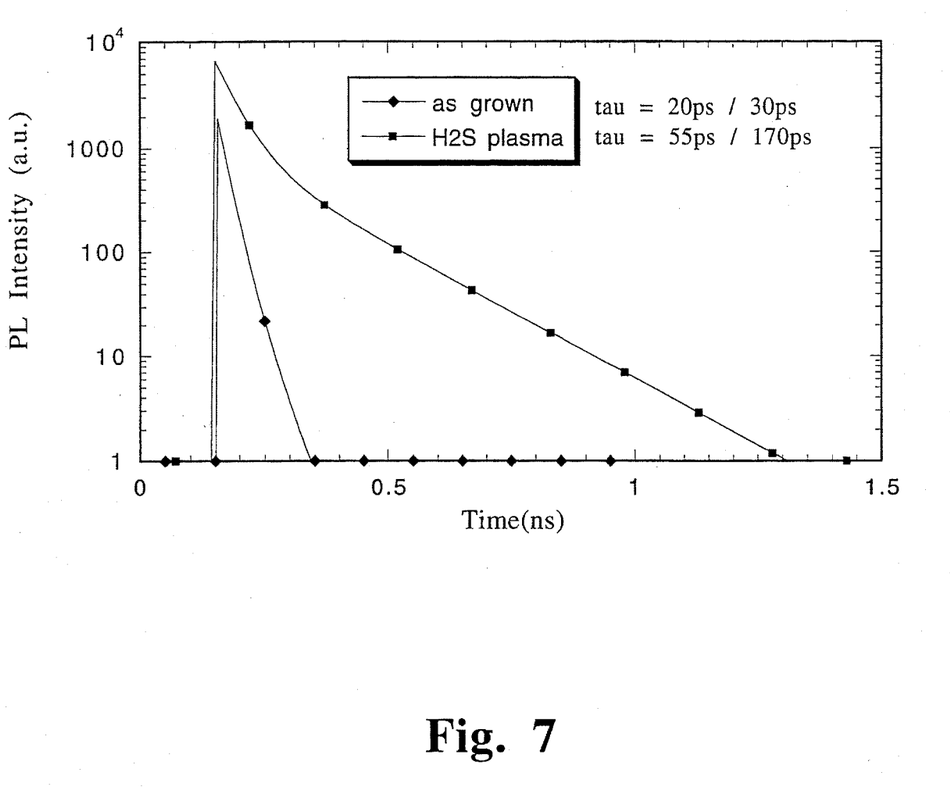
FIG. 7 is a graph showing photoluminescence intensity versus time for a cadmium telluride sample before and after hydrogen sulfide plasma treatment.

Information on the band alignments across the interface of cadmium telluride and cadmium sulfide can be determined by examining the valence band electronic structure. Referring to FIGS. 6a and 6b, the leading edge of the valence band spectra, i.e. the valence band maximum, is shifted 1.2 eV toward higher binding energy following hydrogen sulfide plasma processing at 200° C. Additionally, the general shape of the valence band has changed, with the two peaks now separated by an additional 0.4 eV. This event alone indicates that cadmium sulfide has been formed as a layer on the surface of the cadmium telluride. Thus, it can be concluded that the valence band offset across the interface is 1.2 eV, and that the chemical shift is 0.3 eV, as determined from the difference between the valence band offset and the core level shifts.

The XPS results discussed above conclusively show that the hydrogen sulfide plasma treatment produces a layer of cadmium sulfide on the surface of the cadmium telluride polycrystalline film, thereby effectively forming a heterojunction. Time-resolved photoluminescence measurements of carrier lifetime prove that this layer of cadmium sulfide also reduces the surface recombination velocity through passivation of surface states. FIG. 6 shows the photoluminescence intensity versus time for a cadmium telluride sample before and after the hydrogen sulfide plasma treatment. The photoluminescence lifetime has increased by more than a factor of five, from 30 picoseconds to 170 picoseconds. While there is not a simple, direct expression relating photoluminescence lifetime and surface recombination velocity in polycrystalline cadmium telluride, research indicates that the lifetime in polycrystalline cadmium telluride is limited primarily by surface recombination. Thus, it can be concluded that the surface recombination has been reduced by about a factor of five in the process of the present invention. Such a reduction corresponds to a significant reduction in the number of surface states, which defines passivation.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A process for producing a layer of cadmium sulfide on a cadmium telluride surface, the process comprising:

a. providing a cadmium telluride surface; and b. exposing the cadmium telluride surface to a hydrogen sulfide plasma at an exposure flow rate, an exposure time and an exposure temperature sufficient to permit reaction between the hydrogen sulfide and cadmium telluride to thereby form a cadmium sulfide layer on the cadmium telluride surface.

2. A process for producing a layer of cadmium sulfide on a cadmium telluride surface as claimed in claim 1 wherein the cadmium telluride is a polycrystalline film.

3. A process for producing a layer of cadmium sulfide on a cadmium telluride surface as claimed in claim 2 wherein the cadmium telluride surface is disposed on a glass substrate.

4. A process for producing a layer of cadmium sulfide on a cadmium telluride surface as claimed in claim 3 wherein the exposure time is from about 20 minutes to about 30 minutes.

5. A process for producing a layer of cadmium sulfide on a cadmium telluride surface as claimed in claim 4 wherein the exposure temperature is from about 150° C. to about 200° C.

6. A process for producing a layer of cadmium sulfide on a cadmium telluride surface as claimed in claim 2 wherein the grains of cadmium telluride of the cadmium telluride surface are of a size greater than about 20 µm.

* * * * *